(12) United States Patent
Agarwal et al.

(10) Patent No.: US 8,683,118 B2
(45) Date of Patent: Mar. 25, 2014

(54) MEASURE OF HEALTH FOR WRITING TO LOCATIONS IN FLASH

(71) Applicant: SK hynix memory solutions inc., San Jose, CA (US)

(72) Inventors: Rajiv Agarwal, Menlo Park, CA (US); Marcus Marrow, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 13/869,863

(22) Filed: Apr. 24, 2013

(65) Prior Publication Data

US 2013/0318286 A1    Nov. 28, 2013

Related U.S. Application Data

(63) Continuation of application No. 12/806,125, filed on Aug. 4, 2010, now Pat. No. 8,447,919.

(60) Provisional application No. 61/235,437, filed on Aug. 20, 2009.

(51) Int. Cl.
*G06F 12/00* (2006.01)

(52) U.S. Cl.
USPC .............................. 711/103; 714/718

(58) Field of Classification Search
USPC .............................. 711/103; 714/718
See application file for complete search history.

(56) References Cited

U.S. PATENT DOCUMENTS

| | | | |
|---|---|---|---|
| 2004/0107396 A1* | 6/2004 | Barone et al. | 714/733 |
| 2005/0052908 A1* | 3/2005 | Tomoeda et al. | 365/185.29 |
| 2008/0306723 A1* | 12/2008 | De Ambroggi et al. | 703/21 |

* cited by examiner

*Primary Examiner* — Yong Choe
(74) *Attorney, Agent, or Firm* — Van Pelt, Yi & James LLP

(57) ABSTRACT

A number of pulses to modify information stored in a given location in a plurality of locations is obtained for each of the plurality of locations in flash memory. A location having the largest number of pulses is selecting from the plurality of locations. The selected location is written to.

12 Claims, 8 Drawing Sheets

MEASURE OF HEALTH FOR WRITING TO LOCATIONS IN FLASH

CROSS REFERENCE TO OTHER APPLICATIONS

This application is a continuation of co-pending U.S. patent application Ser. No. 12/806,125 entitled MEASURE OF HEALTH FOR WRITING TO LOCATIONS IN FLASH filed Aug. 4, 2010 which claims priority to U.S. Provisional Patent Application No. 61/235,437 entitled NAND FLASH BLOCK FAILURE PREDICTION USING WRITE AND READ METRICS filed Aug. 20, 2009 which are incorporated herein by reference for all purposes.

BACKGROUND OF THE INVENTION

In flash storage systems, repeatedly writing to flash memory eventually causes a breakdown in the storage media and a much-written-to flash storage system will not be able to hold a charge (i.e., accurately store a data value) for a long period of time. This is undesirable because a user or application will often store information and expect that information be available years later when it is read back. One technique used in some flash storage systems to mitigate this is to track the number of times each location in memory is written to; the storage location with the least number of writes is selected the next time there is something to be written. It would be desirable if new techniques could be developed that further improve the lifetime of a flash storage system.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
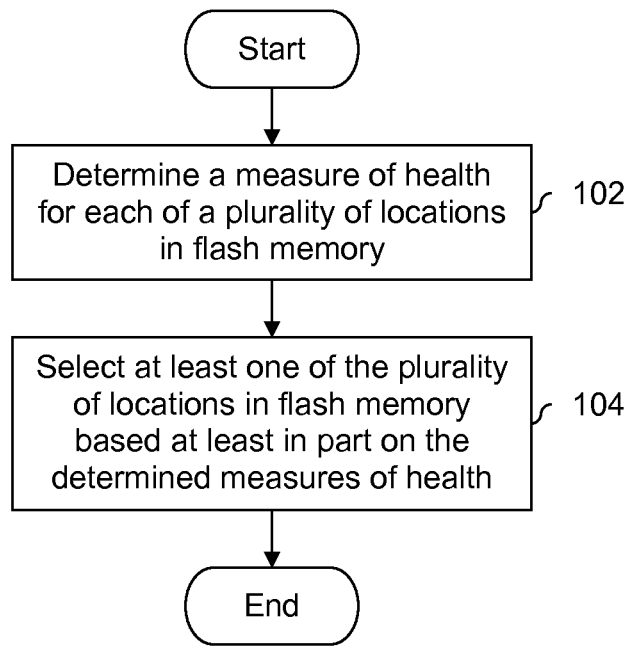
FIG. 1A is a flowchart illustrating an embodiment of a process for selecting a location in flash memory to write to based at least in part on a measure of health.

FIG. 1A is a flowchart illustrating an embodiment of a process for selecting a location in flash memory to write to based at least in part on a measure of health. In some embodiments, the example process shown is triggered when a write command, instruction, or request is received. In some embodiments, the example process is performed by a NAND flash memory system.

At 102, a measure of health is determined for each of a plurality of locations in flash memory. For example, if a memory has 100 candidate locations that can be written to in the future then a measure of health is determined for each of the 100 locations. Although some of the 100 candidate locations may be occupied now, they may become available later. Various examples of measures of health are described in further detail below. In various embodiments, a location can be any unit or size, such as a nibble, byte, page, or block. At 104, at least one of the plurality of locations in flash memory is selected based at least in part on the determined measures of health. For example, if only one location is needed (e.g., because the amount of data being written can fit in a single location) and location X has the "healthiest" measure of health, then location X is selected and that location is written to. In some embodiments, the amount of data being written exceeds one location and multiple locations are selected. In some embodiments, the selected locations are contiguous or adjacent to each other. In other embodiments, locations are selected strictly based on the measures of health without consideration as to and/or constraints relating to contiguous or adjacent locations.

As used herein, a measure of health is a measure, estimate, or representation associated with electrical insulation of a location in memory. For example, it is how well a particular location in memory is able to electrically store a charge (i.e., data) for a relatively long period of time (e.g., 5 years, 10 years, etc.). Flash memory holds information by storing a charge. In real world electronic devices (including flash memory devices) charge leaks out. A "healthy" location in memory is one that can accurately or properly store information (e.g., without "refreshing") for a long period of time because relatively little leakage is occurring. That is, the value read back (e.g., years later) is relatively the same as that which was originally stored or written. An "unhealthy" location in memory is one that leaks charge. In some cases a cell is so unhealthy that the voltage (i.e., data) read back is not necessarily the voltage that was originally stored there even after error correction processing is applied (e.g., because a relatively large amount of leakage occurred). In one example, a measure of health is (inversely) related to the number of errors (or some representation or estimate thereof) in data read back 10 years after the location was written to. In another example, a measure of health is the number of write pulses required to program a location in memory (e.g., with the highest possible voltage or data value).

A variety of factors affect the health of a location in memory. One factor is process variation which results from manufacturing. Flash storage media is a semiconductor which is manufactured using semiconductor processes. During processing, layers are applied and/or stripped using a variety of techniques. As a result of this processing, some locations in the flash media have thicker/thinner layers than other locations in flash media (e.g., because they are on different semiconductor "chips" or they are on the same chip but have different thicknesses at the respective locations). The "intrinsic" health of a location in flash memory will vary accordingly with the thickness of the semiconductor layers at that location. A second factor that affects the health of a particular location is the number of times a location in memory has been used (e.g., written to or erased). For example, programming (i.e., writing) and erasing are two processes that put a lot of stress on memory cells. Certain types of access (e.g., writing) may cause the dielectric at that location to "break down" over time. A location that has been used n times results in more read back errors (e.g., 10 years after the write operation) than one that has been used only m times, where n>>m. Put another way, the health of a location in flash memory deteriorates with usage.

Some other flash memory systems track the number of times each location in memory is written to and use this to select a next location to write to. This technique (sometimes referred to as wear leveling) takes into account how usage affects the health of a location in flash memory. It does not, however, take into account the intrinsic health of a block which depends upon process variation. Because of different thicknesses in the layers of the flash media, some locations are better able to withstand the same number of writes compared to other locations in flash memory. To use an analogy, the wear leveling technique described above is like substituting players in a game based solely on the amount of time played, without taking into consideration the stamina or fitness level of each player. What is described herein is a technique that takes into consideration measures of health associated with locations in memory when selecting a next location to write to. By taking into consideration these measures of health, the lifetime of a flash storage system can be extended beyond the lifetime of another system that only takes into consideration the number of times each location in memory is written to. Another advantage is that overhead storage requirements may be reduced. For example, the number of times a location in memory is written to ($n_{writes}$) may be much larger than a measure of health (e.g., a number of write pulses, $n_{write\ pulses}$) and the amount of information that needs to be stored may be smaller compared to some other systems (e.g., $N \times n_{write\ pulses}$ is less than $N \times n_{writes}$ where N is the number of locations).

Figure 1B:
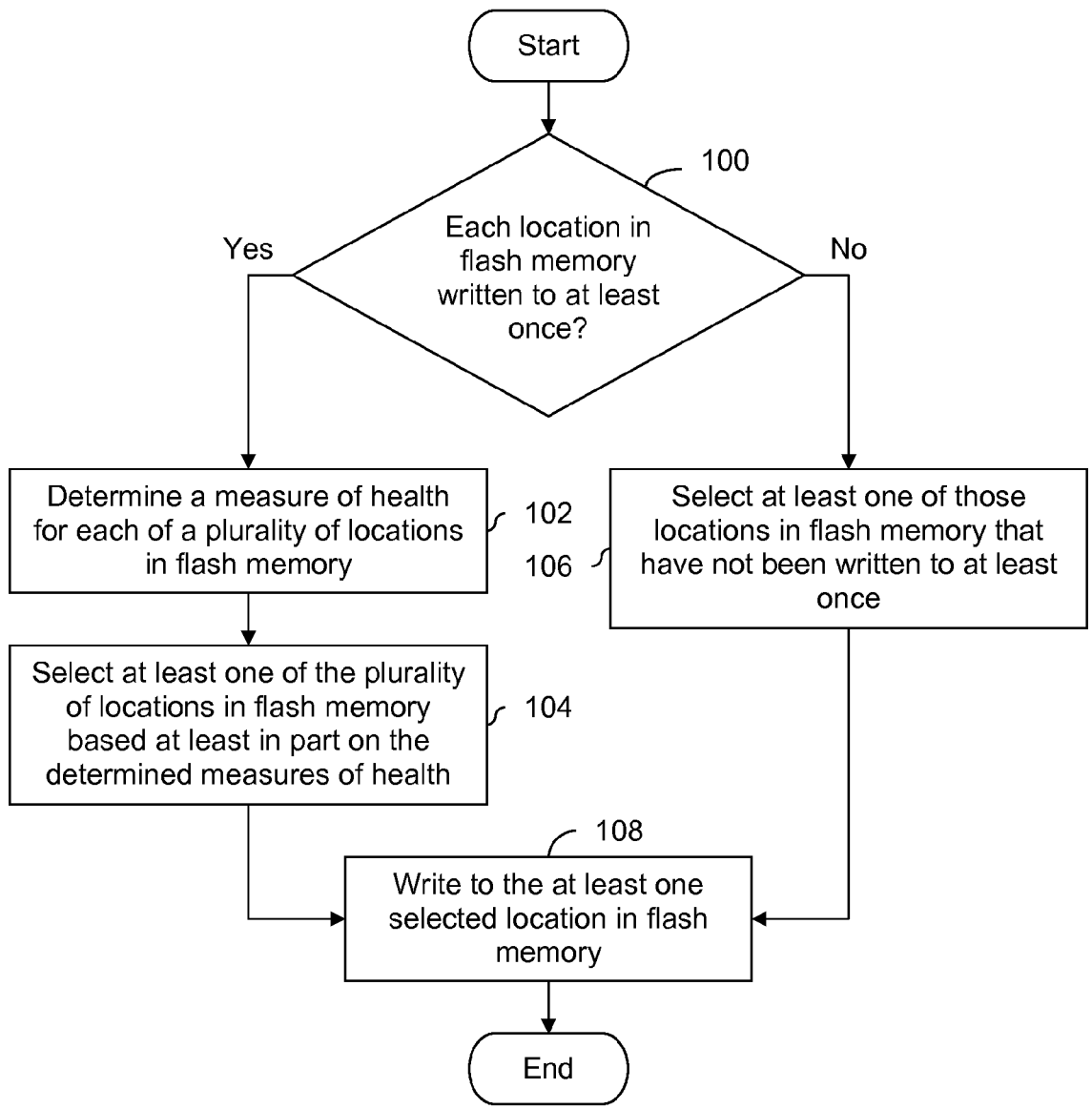
FIG. 1B is a flowchart illustrating an embodiment of a process for selecting a location in memory to write to that takes into consideration whether each location in memory has been written to at least once.

FIG. 1B is a flowchart illustrating an embodiment of a process for selecting a location in memory to write to that takes into consideration whether each location in memory has been written to at least once. In the example shown, some steps correspond to steps shown in FIG. 1A and the same reference numbers are used for those steps.

At 100, it is determined whether each location in a flash memory has been written to at least once. If so, a measure of health is determined for each of a plurality of locations in flash memory at 102. At least one of the plurality of locations in flash memory is selected based at least in part on the determined measures of health at 104. Otherwise, if it is determined there is at least one location that has never been written to at 100 then at least one of those locations in flash memory that have not been written to at least once is selected at 106. This can be done in a variety of ways. In some embodiments, the location in memory with the lowest (highest) address or offset that has never been written to is selected. In some embodiments, one of the locations which has never been written to is selected randomly.

After selecting at least one location at 104 or 106, the at least one selected location in flash memory is written to at 108.

In various embodiments, flash media has a variety of storage capacities. For example, some flash storage systems have only a 1-bit storage capacity where each cell stores one of two possible values (e.g., a voltage level of 0 or $V_1$). Some other flash storage systems have multi-bit storage capacity. For example, a cell may have a 2-bit storage capacity and one of four possible values is stored (e.g., a voltage level of 0, $V_1$, $V_2$, or $V_3$). Although some embodiments described herein show 2-bit capacity examples, the technique described herein is applicable for any storage capacity.

Figure 2:
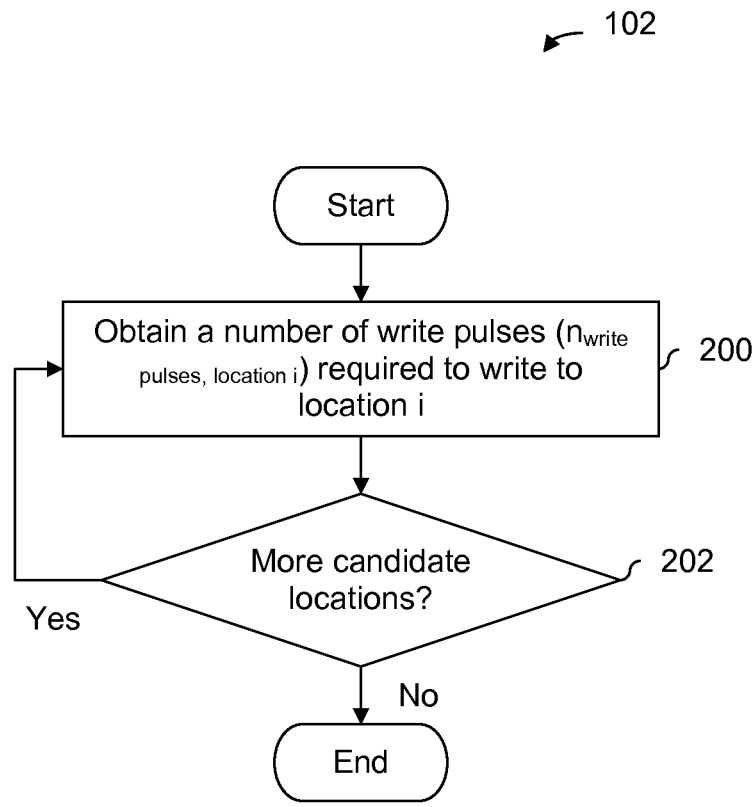
FIG. 2 is a flowchart illustrating an embodiment of a process for determining a measure of health using a number of write pulses.

FIG. 2 is a flowchart illustrating an embodiment of a process for determining a measure of health using a number of write pulses. In some embodiments, step 102 from FIGS. 1A-1B include the example process shown. In some other embodiments, step 102 is performed in some other manner.

A number of write pulses ($n_{write\ pulses,location\ i}$) required to write to location i (e.g., during a most recent write operation) is obtained at 200. In some embodiments, this information is stored in a table, array, list, or other data structure where each entry in the data structure includes a first field containing the number of (required) write pulses and a second field containing the corresponding location. In some embodiments, a location comprises a page where a page is a unit of memory in flash and in NAND flash memory writes are performed on a page level basis. Another unit of memory is a block and erasures (at least in NAND flash memory) are performed on a block level; a page is smaller than a block. As used herein, a number of write pulses is the number of cycles or pulses required to write to a location in flash memory. For example, a NAND flash system will apply a charge to a page (NAND systems perform writes at the page level) and cells in the page that are "on" will be charged up. The system then checks the voltages that are stored in the page (e.g., a pattern of [$V_{read,cell1}$ $V_{read,cell2}$ $V_{read,cell3}$ $V_{read,cell4}$] and if needed turns off any cells in the page that have achieved their desired voltage level. This process is repeated until all cells in the page have achieved their desired voltage level. One such cycle of writing and checking constitutes one write cycle or one write pulse. In some embodiments, only the most recent number of write pulses for each location is stored and later used at 200. For example, suppose a page has been written to twice.

The number of write pulses required to write to that page the second time is stored and (e.g., to save memory) the number of write pulses required to write to the page the first time is discarded.

At 202, it is determined if there are more candidate locations. If so, the number of write pulses for a next location is obtained at 200. Otherwise the process ends.

Figure 3A:
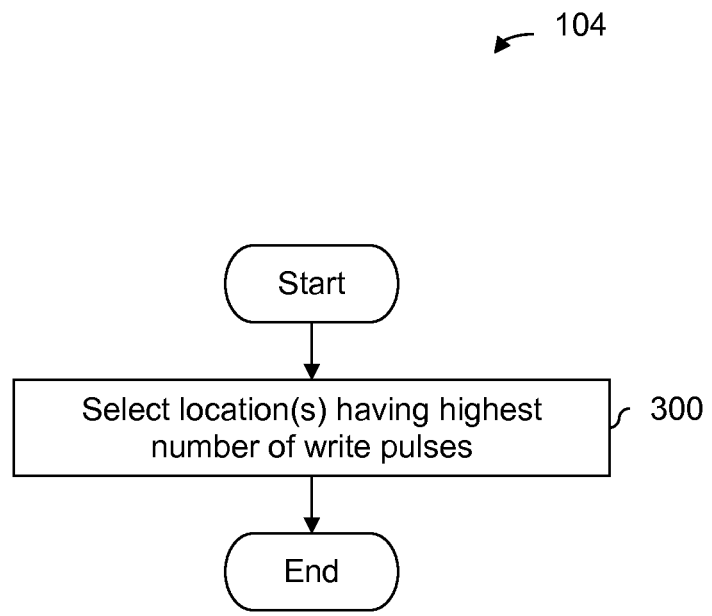
FIG. 3A is a flowchart illustrating an embodiment of a process for selecting at least one location based at least in part on a number of write pulses.

FIG. 3A is a flowchart illustrating an embodiment of a process for selecting at least one location based at least in part on a number of write pulses. In some embodiments, step 104 from FIGS. 1A-1B include the example process shown; this embodiment corresponds to and/or is used with the embodiment of FIG. 2. In some other embodiments, step 104 is performed in some other manner.

At 300, locations(s) having the highest number of write pulses is/are selected. A location (such as a page) that is written to easily (i.e., requires fewer write pulses) is one that will conversely also lose charge faster. Therefore, a higher number of write pulses required indicates or corresponds to better health. "Healthier" locations are selected to be written to next by selecting those locations requiring the highest number of write pulses in this embodiment.

Figure 3B:
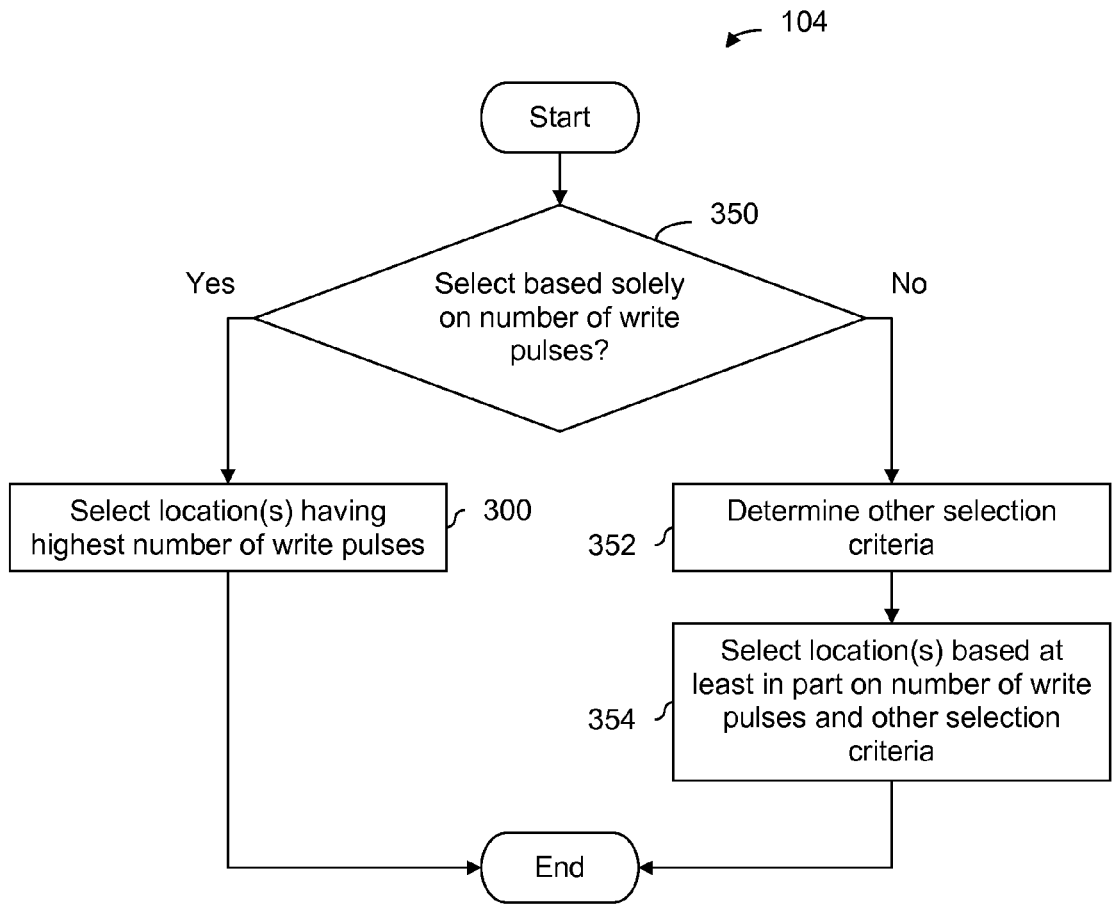
FIG. 3B is a flowchart illustrating an embodiment of a process for selecting at least one location which takes into consideration whether the selection is based solely on a number of write pulses.

FIG. 3B is a flowchart illustrating an embodiment of a process for selecting at least one location which takes into consideration whether the selection is based solely on a number of write pulses. In some embodiments, step 104 from FIGS. 1A-1B includes the example process.

At 350 it is determined whether to select based solely on a number of write pulses. For example, in some cases there may be other factors or criteria to consider (e.g., in addition to a number of write pulses) when selecting a location to write to. In some embodiments, there may be location constraints. For example, the system may want to write to a specified chip or within a specified region of a specified chip.

If it is determined to select based solely on a number of write pulses at 350 then the location(s) having the highest number of write pulses is/are selected at 300. Otherwise, other selection criteria is/are determined at 352. In one example described above, there are constraints related to position or location (e.g., specifying/constraining the selection to a specified chip and/or a specified region within a chip). At 354 location(s) is/are selected based at least in part on a number of write pulses and other selection criteria. For example, the process may select those locations within a desired chip or desired region of a desired chip that has the highest number of write pulses. In another example, two or more locations are to be selected (e.g., because the amount of data to be written cannot fit in a single location) and the other selection criteria is that they must be contiguous or adjacent locations. In some embodiments, the contiguous or adjacent locations having the highest average number of write pulses is selected. For example, suppose there are 3 pages (page n, page n+1, and page n+2) and two contiguous or adjacent pages are to be selected. A first average of the number of write pulses is obtained for pages n and n+1 and a second average of the number of write pulses is obtained for pages n+1 and n+2. The pages corresponding to the higher of the first average and second average is selected. In another embodiment, the highest minimum number of write pulses is selected. For example, a first minimum is obtained for pages n and n+1 (i.e., $\min(n_{write\ pulses, page\ n}, n_{write\ pulses, page\ n+1})$) and a second minimum is obtained for n+1 and n+2 (i.e., $\min(n_{write\ pulses, page\ n+1}, n_{write\ pulses, page\ n+2})$). The pages (i.e., pages n and n+1 or pages n+1 and n+2) corresponding to the higher of the two minimums is selected.

Figure 4:
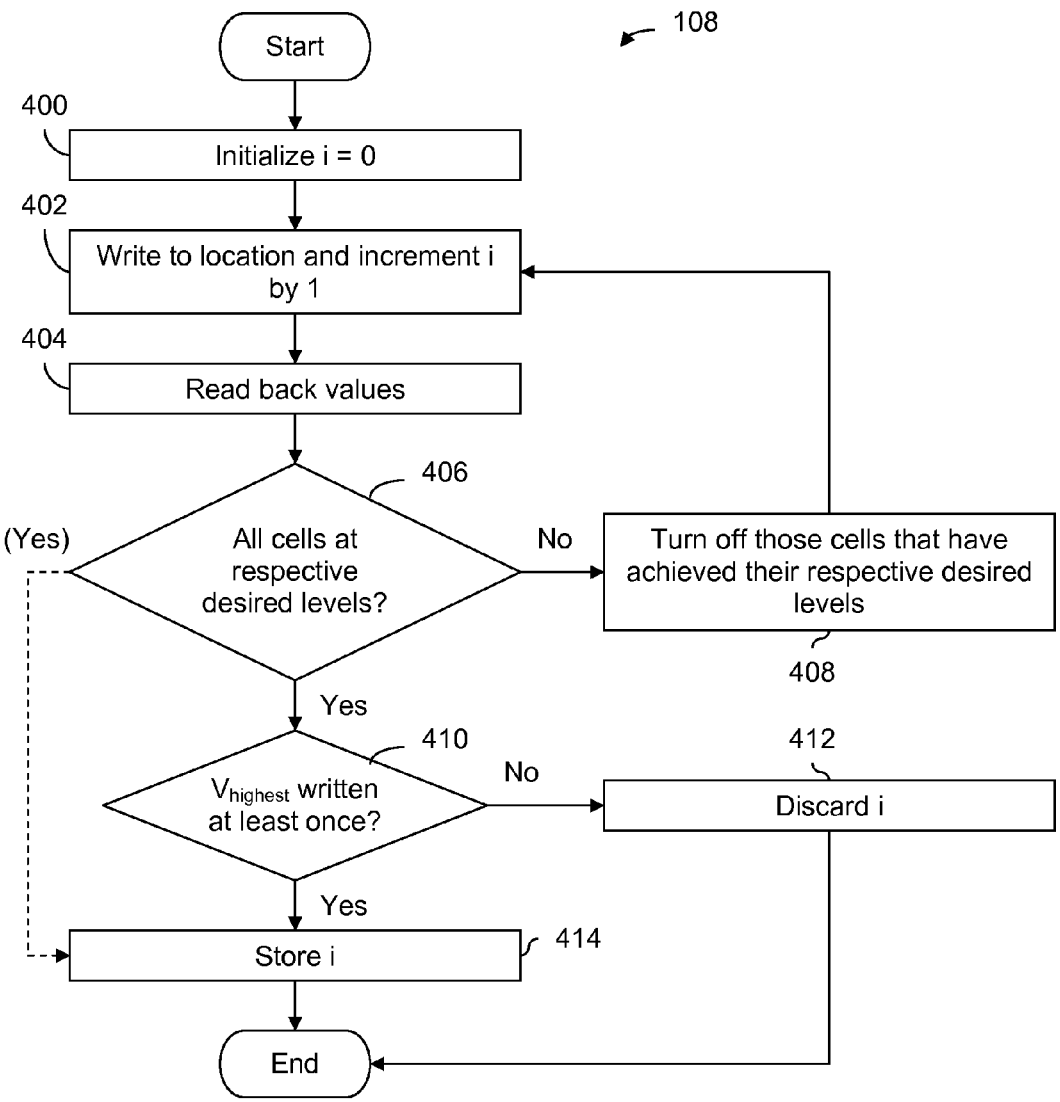
FIG. 4 is a flowchart illustrating an embodiment of a process for generating and storing measures of health.

FIG. 4 is a flowchart illustrating an embodiment of a process for generating and storing measures of health. In some embodiments, step 108 in FIG. 1B includes the example process shown. In the example shown, measures of health are related to a number of write pulses required to write to a location in flash memory and are counted and stored during a write process. In the example shown, the particular location (e.g., a specific page) to write to has already been selected.

At 400, i (e.g., a counter) is initialized to 0. At 402, a location is written to and i is incremented by 1. For example, the command "Write data pattern $[V_1\ 0\ V_3\ V_2]$ to page Y" may have been received and page Y is written to. At 404, values are read back and it is determined at 406 whether all cells in a page are at their respective desired levels. For example, if the command is "Write data pattern $[V_1\ 0\ V_3\ V_2]$ to page Y" then at 404 a read pattern of $[V_{read,cell1}\ V_{read,cell2}\ V_{read,cell3}\ V_{read,cell4}]$ is obtained and it is compared at 406 against the write data pattern of $[V_1\ 0\ V_3\ V_2]$.

If not all cells are at their respective desired levels, then those cells that have achieved their respective desired levels are turned off at 408. For example, if the first and second cells have achieved voltage levels of $V_1$ and 0 (respectively) then those cells are turned off. The location is then written to again and i is further incremented by 1 at 402.

Otherwise, if all cells are at their respective desired levels then it is determined at 410 whether $V_{highest}$ was written at least once. $V_{highest}$ is the highest possible voltage level and for a 2-bit capacity system is $V_3$ (where the possible voltage values are 0, $V_1$, $V_2$, and $V_3$). For example, write pattern of $[V_2\ 0\ V_1\ V_1]$ in a 2-bit capacity system does not include $V_{highest}$ whereas the write pattern $[V_2\ 0\ V_3\ V_1]$ does. If $V_{highest}$ is written at least once then i is stored at 414, otherwise i is discarded at 412. In some embodiments, any previous count for that location is discarded at 414 when storing i. For example, if this is the $n^{th}$ time a particular page is being written to, the number of write pulses required to write to the page during the $(n-1)^{th}$ time is discarded or overwritten.

In some embodiments, the checking performed at step 410 is optional and the count i is always stored at 414 without performing the checking at 410. See, for example, the dashed line in FIG. 4.

Figure 5:
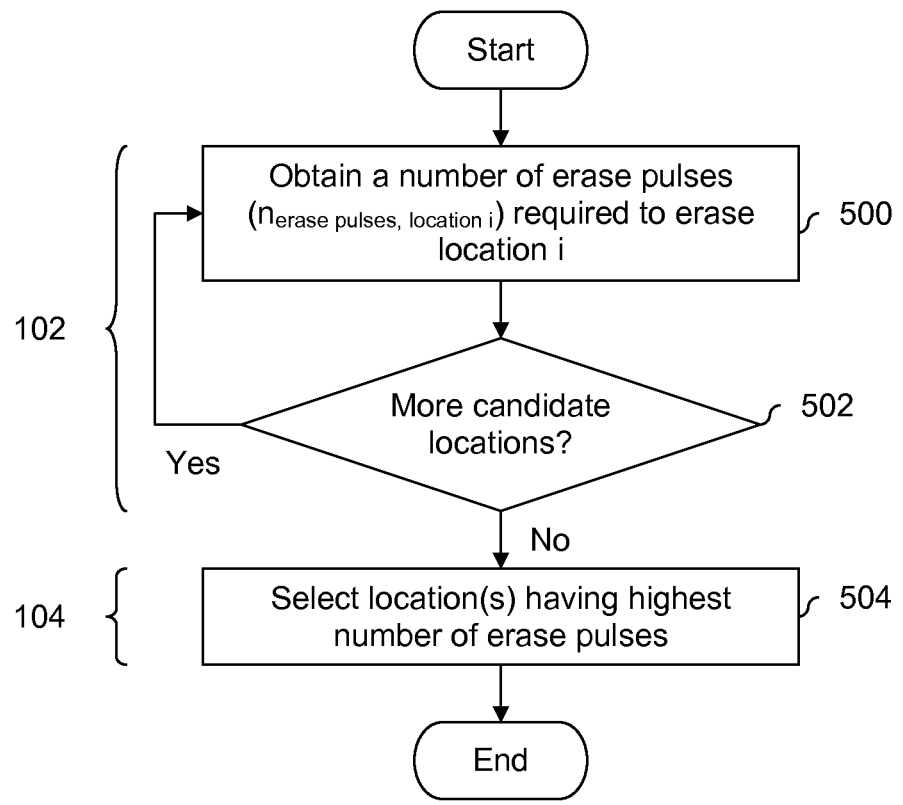
FIG. 5 is a flowchart illustrating an embodiment of a process for selecting a location based at least in part on a number of erase pulses.

FIG. 5 is a flowchart illustrating an embodiment of a process for selecting a location based at least in part on a number of erase pulses. In some embodiments, steps 102 and 104 from FIGS. 1A and 1B include the example steps shown. At 500, a number of erase pulses ($n_{erase\ pulses,\ location\ i}$) required to erase location i (e.g., during a most recent erase operation) are obtained. In some embodiments, when a location is erased, the location and the number of erase pulses required to erase that location are stored. In some embodiments, the locations for which a number of erase pulses is obtained at 500 include only free locations that are available for storage. At 502 it is determined if there are more candidate locations. If so, the number of erase pulses required to erase a next location is obtained at 500. If it is determined at 502 there are no more candidate locations then at 504 location(s) having the highest number of erase pulses is/are selected. For example, a high number of erase pulses may correspond to better health.

In some flash systems (e.g., NAND flash systems), writes are performed at the page level and erasures are performed at the block level where a block includes a plurality of pages. In some embodiments, the locations used in steps 500 and 502 are blocks and the locations used in step 504 are pages. In some embodiments, selecting a location at 504 includes selecting a block having the highest number of erase pulses and selecting one of the free pages in the block. In various embodiments, various techniques are used to select free page(s) in a block (e.g., select randomly, select the page having the highest/lowest offset, etc.).

Some of the techniques shown in previous figures can be combined with the technique of using a number of erase pulses as a measure of health. For example, FIG. 4 may be modified to show how a number erase pulses are counted and stored during an erase command and FIG. 3B may be modified to show how a selection process can take into account other selection criteria or perform the selection based solely on a number of erase pulses.

Figure 6:
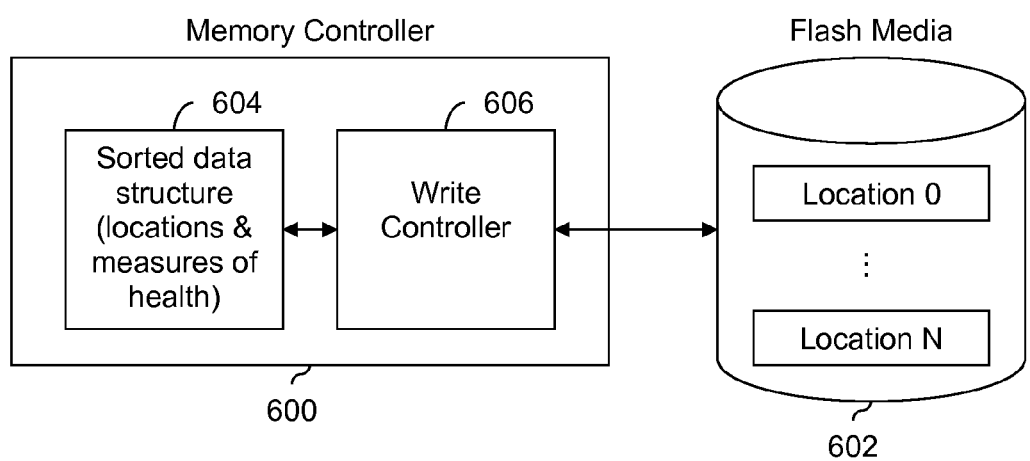
FIG. 6 is a diagram showing an embodiment of a system for storing and using measures of health in writing to flash memory.

FIG. 6 is a diagram showing an embodiment of a system for storing and using measures of health in writing to flash memory. In the example shown, memory controller 600 controls reading, writing, and erasing operations performed on flash media 602. Flash media 602 includes a plurality of locations. For example, the locations may be blocks, pages, etc.

Write controller 606 determines a next location to write to in flash media 602 when a write instruction is received. Prior to performing the write operation, write controller 606 uses measures of health for locations 0-N stored in sorted data structure 604. In some embodiments, write controller 606 sends a query of "What location has the highest measure of health?" to sorted data structure 604 and sorted data structure 604 returns a location to write controller 606. In various embodiments, sorted data structure 604 is implemented using a balanced tree, a list, an array, etc. In some embodiments a measure of health is related to a number of write pulses and sorted data structure 604 stores numbers of write pulses for pages and returns a page number. In some embodiments sorted data structure 604 stores numbers of erase pulses for pages and returns one or more blocks. In some such embodiments, write controller 606 selects an available page from the block returned by sorted data structure 604.

Once the location(s) to write to have been determined, write controller 606 writes to that location in flash media 602. In some embodiments, after this or any write operation is performed, the number of write pulses for that location is stored in sorted data structure 604. In some embodiments, after any erase operation is performed, the number of erase pulses required to erase a location is stored in sorted data structure 604.

In some embodiments, sorted data structure 604 is able to operate in a mode where other or additional selection criteria are used. In some embodiments sorted data structure 604 includes: a mode input, a chip input, and an input specifying a range of addresses or locations within a flash memory chip. In a first mode (e.g., mode input=00), the inputs specifying the flash memory chip and range of addresses are ignored and a location is selected solely based on a measure of health (e.g., a number of write pulses). In a second mode (e.g., mode input=01), a location within a specified chip having the highest measure of health is selected (i.e., the input specifying the flash memory chip is used but the input specifying a range of addresses is ignored). In a third mode (e.g., mode input=10), a location within a specified address range of a specified chip having a highest measure of health is selected (i.e., both the input specifying the flash memory chip and the input specifying a range of addresses are used). In some embodiments, sorted data structure 604 includes an input specifying a number of locations to select.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for writing to flash memory, comprising:
obtaining, for each of a plurality of locations in flash memory, a number of pulses to modify information stored in a given location in the plurality of locations, wherein:
   the number of pulses includes a number of write pulses; and
   obtaining includes:
      receiving one or more write instructions to write to the plurality of locations; and
      in response to receiving the one or more write instructions, for each of the plurality of locations:
         writing a write pattern to a given location in the plurality of locations to obtain a number of write pulses;
         determining if the write pattern includes a highest possible voltage level;
         in the event the write pattern includes the highest possible voltage level, storing the number of write pulses obtained from writing the write pattern; and
         in the event the write pattern does not include the highest possible voltage level, discarding the number of write pulses obtained from writing the write pattern;
using a processor to select, from the plurality of locations, a location having the largest number of pulses; and
writing to the selected location.

2. The method of claim 1 further comprising:
determining if each of the plurality of locations has been written to at least once; and
in the event at least one location in the plurality of locations has not been written to at least once, selecting at least one of those locations that has not been written to at least once, wherein the location having the largest number of pulses is not selected.

3. A method for writing to flash memory, comprising:
obtaining, for each of a plurality of locations in flash memory, a number of pulses to modify information stored in a given location in the plurality of locations, wherein:
   the number of pulses includes a number of erase pulses; and
   obtaining includes:
      receiving one or more erase instructions to erase the plurality of locations; and
      in response to receiving the one or more erase instructions, for each of the plurality of locations:
         erasing a given location in the plurality of locations to obtain a number of erase pulses; and
         storing the number of erase pulses obtained from erasing the given location;
using a processor to select, from the plurality of locations, a location having the largest number of pulses; and
writing to the selected location.

4. The method of claim 3 further comprising:
determining if each of the plurality of locations has been written to at least once; and
in the event at least one location in the plurality of locations has not been written to at least once, selecting at least one of those locations that has not been written to at least once, wherein the location having the largest number of pulses is not selected.

5. A system for writing to flash memory, comprising:
a memory controller configured to:
obtain, for each of a plurality of locations in flash memory, a number of pulses to modify information stored in a given location in the plurality of locations, wherein:
the number of pulses includes a number of write pulses; and
the memory controller is configured to obtain, including by:
receiving one or more write instructions to write to the plurality of locations; and
in response to receiving the one or more write instructions, for each of the plurality of locations:
writing a write pattern to a given location in the plurality of locations to obtain a number of write pulses;
determining if the write pattern includes a highest possible voltage level;
in the event the write pattern includes the highest possible voltage level, storing the number of write pulses obtained from writing the write pattern; and
in the event the write pattern does not include the highest possible voltage level, discarding the number of write pulses obtained from writing the write pattern;
select, from the plurality of locations, a location having the largest number of pulses; and
write to the selected location; and
the flash memory.

6. The system of claim 5, wherein the memory controller is further configured to:
determine if each of the plurality of locations has been written to at least once; and
in the event at least one location in the plurality of locations has not been written to at least once, select at least one of those locations that has not been written to at least once, wherein the location having the largest number of pulses is not selected.

7. A system for writing to flash memory, comprising:
a memory controller configured to:
obtain, for each of a plurality of locations in flash memory, a number of pulses to modify information stored in a given location in the plurality of locations, wherein:
the number of pulses includes a number of erase pulses; and
the memory controller is configured to obtain, including by:
receiving one or more erase instructions to erase the plurality of locations; and
in response to receiving the one or more erase instructions, for each of the plurality of locations:
erasing a given location in the plurality of locations to obtain a number of erase pulses; and
storing the number of erase pulses obtained from erasing the given location;
select, from the plurality of locations, a location having the largest number of pulses; and
write to the selected location; and
the flash memory.

8. The system of claim 7, wherein the memory controller is further configured to:
determine if each of the plurality of locations has been written to at least once; and
in the event at least one location in the plurality of locations has not been written to at least once, select at least one of those locations that has not been written to at least once, wherein the location having the largest number of pulses is not selected.

9. A computer program product for writing to flash memory, the computer program product being embodied in a non-transitory computer readable storage medium and comprising computer instructions for:
obtaining, for each of a plurality of locations in flash memory, a number of pulses to modify information stored in a given location in the plurality of locations, wherein:
the number of pulses includes a number of write pulses; and
the computer instructions for obtaining include computer instructions for:
receiving one or more write instructions to write to the plurality of locations; and
in response to receiving the one or more write instructions, for each of the plurality of locations:
writing a write pattern to a given location in the plurality of locations to obtain a number of write pulses;
determining if the write pattern includes a highest possible voltage level;
in the event the write pattern includes the highest possible voltage level, storing the number of write pulses obtained from writing the write pattern; and
in the event the write pattern does not include the highest possible voltage level, discarding the number of write pulses obtained from writing the write pattern;
selecting, from the plurality of locations, a location having the largest number of pulses; and
writing to the selected location.

10. The computer program product of claim 9 further comprising computer instructions for:
determining if each of the plurality of locations has been written to at least once; and
in the event at least one location in the plurality of locations has not been written to at least once, selecting at least one of those locations that has not been written to at least once, wherein the location having the largest number of pulses is not selected.

11. A computer program product for writing to flash memory, the computer program product being embodied in a non-transitory computer readable storage medium and comprising computer instructions for:
obtaining, for each of a plurality of locations in flash memory, a number of pulses to modify information stored in a given location in the plurality of locations, wherein:
the number of pulses includes a number of erase pulses; and
the computer instructions for obtaining include computer instructions for:
receiving one or more erase instructions to erase the plurality of locations; and
in response to receiving the one or more erase instructions, for each of the plurality of locations:

erasing a given location in the plurality of locations to obtain a number of erase pulses; and
storing the number of erase pulses obtained from erasing the given location;
selecting, from the plurality of locations, a location having the largest number of pulses; and
writing to the selected location.

12. The computer program product of claim 11 further comprising computer instructions for:
determining if each of the plurality of locations has been written to at least once; and
in the event at least one location in the plurality of locations has not been written to at least once, selecting at least one of those locations that has not been written to at least once, wherein the location having the largest number of pulses is not selected.

* * * * *